(12) United States Patent
Quenard et al.

(10) Patent No.: US 10,798,850 B2
(45) Date of Patent: Oct. 6, 2020

(54) PROTECTED ELECTRONIC DEVICE

(71) Applicants: COMMISSARIAT A L'ENERGIE ATOMIQUE ET AUX ENERGIES ALTERNATIVES, Paris (FR); AIRBUS OPERATIONS (S.A.S.), Toulouse (FR)

(72) Inventors: Sebastien Quenard, Le Sappey en Chartreuse (FR); Lina Laifa, Grenoble (FR); Ulrich Soupremanien, Saint Marcellin (FR); Helga Szambolics, Grenoble (FR); Olivier Verseux, Tournefeuilles (FR)

(73) Assignees: COMMISSARIAT A L'ENERGIE ATOMIQUE ET AUX ENERGIES ALTERNATIVES, Paris (FR); AIRBUS OPERATIONS (S.A.S.), Toulouse (FR)

( * ) Notice: Subject to any disclaimer, the term of this patent is extended or adjusted under 35 U.S.C. 154(b) by 338 days.

(21) Appl. No.: 15/799,500

(22) Filed: Oct. 31, 2017

(65) Prior Publication Data
US 2018/0124945 A1    May 3, 2018

(30) Foreign Application Priority Data

Oct. 31, 2016 (FR) .................... 16 60567

(51) Int. Cl.
*G01D 11/10* (2006.01)
*H05K 7/20* (2006.01)
(Continued)

(52) U.S. Cl.
CPC .......... *H05K 7/2039* (2013.01); *G01D 11/10* (2013.01); *G01D 11/245* (2013.01); *H01L 23/42* (2013.01);
(Continued)

(58) Field of Classification Search
None
See application file for complete search history.

(56) References Cited

U.S. PATENT DOCUMENTS 9,757,271 B2 * 9/2017 Shih .................. A61F 7/0085
2003/0112603 A1  6/2003 Roesner et al.
(Continued)

FOREIGN PATENT DOCUMENTS

EP    2 107 864 A2    10/2009
EP    2 738 803 A2    6/2014
(Continued)

OTHER PUBLICATIONS

French Preliminary Search Report dated Jun. 22, 2017 in French Application 16 60567, filed on Oct. 31, 2016 (with English Translation of Categories of cited documents).

*Primary Examiner* — William C Vaughn, Jr.
*Assistant Examiner* — Joseph Daniel A Towe
(74) *Attorney, Agent, or Firm* — Oblon, McClelland, Maier & Neustadt, L.L.P.

(57) ABSTRACT

An electronic device includes an electronic component and a protective shield including a phase change material having a phase change temperature of between 20° C. and 90° C., an antivibration gel having hyperelastic and/or viscoelastic behavior at 20° C., and a separation barrier positioned so as to separate the phase change material and the antivibration gel. The antivibration gel is positioned, at least partly, in contact with the electronic component, and has a thermal conductivity of greater than 1 W/m·K at 20° C.

21 Claims, 2 Drawing Sheets

(51) Int. Cl.
  *H01L 23/427*  (2006.01)
  *H01L 23/42*   (2006.01)
  *G01D 11/24*   (2006.01)
  *H04N 5/225*   (2006.01)
  *H04N 5/33*    (2006.01)
  *H05K 9/00*    (2006.01)

(52) U.S. Cl.
  CPC ....... *H01L 23/4275* (2013.01); *H04N 5/2252* (2013.01); *H04N 5/33* (2013.01); *H05K 9/0058* (2013.01)

(56) References Cited

U.S. PATENT DOCUMENTS

| | | | |
|---|---|---|---|
| 2005/0104029 A1* | 5/2005 | Neuschuetz | C09K 5/063 252/70 |
| 2008/0131722 A1* | 6/2008 | Suhir | C23C 28/322 428/616 |
| 2009/0262503 A1 | 10/2009 | Kaneko et al. | |
| 2013/0141866 A1* | 6/2013 | Refai-Ahmed | H01L 23/3672 361/679.54 |
| 2014/0153193 A1 | 6/2014 | Engelhardt et al. | |
| 2016/0226114 A1* | 8/2016 | Hartmann | C08G 18/48 |

FOREIGN PATENT DOCUMENTS

| | | |
|---|---|---|
| FR | 2 932 944 A1 | 12/2009 |
| JP | 2005-129820 | 5/2005 |
| JP | 2015-56562 | 3/2015 |
| KR | 10-2014-0053629 | 5/2014 |

\* cited by examiner

PROTECTED ELECTRONIC DEVICE

TECHNICAL FIELD

The invention relates to an electronic device comprising a shield that protects against thermal peaks and vibrations.

PRIOR ART

Electronic components may be used in harsh vibration and thermal environments, for example in automotive, aeronautical or space applications, in particular in the vicinity of an engine. In these environments, the temperature may increase rapidly, up to values that the electronic components cannot withstand.

For example, conventionally, an infrared surveillance video camera for monitoring the operation of an engine cannot withstand temperatures above 85° C. which may be temporarily achieved in the vicinity of the engine. A heat shield is therefore necessary. The heat shield may in particular comprise phase change materials (PCMs) capable of absorbing, over a limited time, a large amount of heat energy.

In automotive, aeronautical or space applications, it is also essential to protect the electronic component from vibrations and/or from shocks. The vibration environments vary widely depending on the applications. In particular, the vibration frequencies may vary from 5 Hz to 2 KHz with acceleration peaks that may change from 0.1 to 70 G for one peak.

Many materials known for absorbing vibrations exist, in particular silicone-based elastomers and/or gels. These materials are in general processed at high temperature in order to enable the bridging between the macromolecules. Their maximum operating temperature may reach 150° C. to 250° C. They conventionally have a low modulus of elasticity, a high damping factor and hyperelastic or viscoelastic behavior at a temperature above their glass transition temperature. They are generally highly deformable at ambient temperature.

Furthermore, in automotive, aeronautical or space applications, the volume available for the electronic component is limited. The protection must be particularly effective.

There is a constant need for solutions that make it possible to effectively protect an electronic component used in harsh vibration and thermal environments.

One objective of the invention is to at least partially meet this need.

SUMMARY OF THE INVENTION

The invention proposes an electronic device comprising:
an electronic component;
a protective shield intended to protect the electronic component from a vibration environment having thermal peaks at a temperature above 80° C., the protective shield comprising:
  a phase change material having a phase change temperature of between 20° C. and 90° C.,
  an antivibration gel, having hyperelastic and/or viscoelastic behavior at 20° C.,
  a separation barrier positioned so as to separate the phase change material and the antivibration gel,
the antivibration gel being positioned, at least partly, in contact with the electronic component, and having a thermal conductivity of greater than 1 W/m·K at 20° C.

The inventors have observed that the heat energy released by the electronic component could contribute substantially to the increase in the temperature of the electronic component. Contrary to standard practice, which consists in promoting the thermal insulation of the electronic component, they imagined that it could be useful to promote heat exchanges between the electronic component and the phase change material, in particular by positioning an antivibration gel having a high thermal conductivity in close thermal communication with the phase change material.

As will be seen in greater detail in the remainder of the description, the antivibration gel does not act as a thermal barrier but promotes the heat exchanges with the phase change material. The phase change material may therefore simultaneously be used to store the heat energy received from the outside environment, and also received from the electronic component itself.

This dual action of the phase change material advantageously makes it possible to ensure good protection of the electronic component, while limiting the volume occupied by the electronic device.

The choice of an antivibration gel having a high thermal conductivity also makes it possible to improve the heat exchanges with the outside when the temperature of this environment has returned to normal.

An electronic device according to the invention may also comprise one or more of the following optional and preferred features:
  the electronic component is selected from the group formed by
    an electrical power supply, for example a battery,
    a data storage memory, for example an SD card,
    a communicating node, for example a member of a wireless network, and
    a measurement device, for example an infrared video camera, a temperature sensor, an accelerometer, a magnetometer, a goniometer, a pressure sensor, or a pyrometer;
  the antivibration gel is selected from the group formed by elastomers, preferably produced from silicone;
  the antivibration gel preferably has a thermal conductivity of greater than 1.5 W/m·K, preferably greater than 2 W/m·K, preferably greater than 2.5 W/m·K, preferably greater than 3 W/m·K;
  the antivibration gel has a modulus of elasticity at 20° C. of less than 1 MPa;
  the phase change material has a phase change temperature preferably greater than 40° C., preferably greater than 60° C., and/or less than 85° C., preferably less than 80° C., preferably less than 70° C.;
  preferably, the phase change material is selected from the group formed by organic phase change materials, in particular paraffins and fatty acids, and inorganic phase change materials, in particular salt hydrates;
  the electronic component is preferably embedded in the antivibration gel;
  the separation barrier is a material having a thermal conductivity of greater than 5 W/m·K, preferably greater than 10 W/m·K;
  the antivibration gel and/or the phase change material is positioned in the form of a layer;
  the antivibration gel is positioned, at least partly, preferably completely, between the electronic component and the phase change material, the antivibration gel and the phase change material preferably being at least partly, preferably completely, in the form of layers;

the separation barrier is preferably made of plastic or made of a metal, preferably selected from aluminum, copper, a steel, in particular a stainless steel, and alloys of these metals;

the separation barrier has the shape of an inner shell, preferably having a thickness of less than 3 mm, less than 2 mm, preferably less than 1 mm;

the electronic component and the antivibration gel are contained in the inner shell;

in one embodiment, a portion of the electronic component juts out however beyond the inner shell;

the protective shield comprises a composite layer comprising a mixture of said antivibration gel and of said phase change material;

the phase change material is at least partly, or even completely, contained in capsules dispersed within the antivibration gel, the separation barrier then being, at least partly, preferably completely, formed by the walls of said capsules, which are preferably formed of ceramic, of silica or of a polymer, preferably of a plastic polymer of polyethylene or polyamide type, preferably of a thermosetting polymer, the largest dimension of any one capsule preferably being less than 1000 μm, less than 100 μm, less than 50 μm, or less than 5 μm, the thickness of the wall of any one capsule preferably being between 1 μm and 5 nm;

preferably, each capsule contains phase change material;

the electronic device comprises an outer shell, preferably made of aluminum, of a stainless steel or of plastic, in which the electronic component, the phase change material and the antivibration gel are contained; in one embodiment, a portion of the electronic component juts out however beyond the outer shell;

preferably, the inner shell and/or the outer shell has (have) ribs that promote heat exchanges between the antivibration gel and the phase change material, and between the phase change material and the outside environment, respectively;

preferably the outer shell and/or the inner shell has (have) electromagnetic shielding.

The invention also relates to the use of an electronic device according to the invention in a vibration environment having acceleration peaks of greater than 0.1 G, greater than 1 G, greater than 10 G, greater than 30 G, greater than 50 G, greater than 60 G, or greater than 70 G over a range of frequencies from 5 to 2000 Hz, and the temperature of which may exceed 90° C., or even 120° C., for a period that may be more than 10 minutes, or even more than 30 minutes, more than 1 hour, more than 2 hours, more than 2.5 hours and, preferably, less than 5 hours, preferably less than 4 hours, preferably less than three hours. Preferably, in this environment, the temperature never exceeds 200° C.

The invention also relates to an engine unit comprising an engine, an electronic device according to the invention and, optionally, a "monitored" member, said device monitoring the operation of said engine and/or of said monitored member.

The monitored member is preferably positioned close to, preferably at less than 2 meters from, preferably at less than 1 meter from, the engine. The monitored member may in particular be an electrical housing, an electrical part or apparatus, an electronic control unit, a mechanical part or apparatus.

Preferably, the electronic device comprises an infrared video camera that takes images of said engine or of said monitored member.

The invention lastly relates to a vehicle, in particular a motor vehicle, aircraft or spacecraft, comprising an electronic device or an engine unit according to the invention, in particular an automobile, an airplane, a space shuttle or a rocket.

Definitions

An "electronic component" is understood to mean not only an individual electronic component, such as a chip or printed circuit bearing individual electronic components, but also an apparatus containing such individual electronic components, such as a still camera or a video camera.

The separation barrier "separates" the phase change material and the antivibration gel when it physically separates this material and this gel, while being in contact therewith.

Viscoelastic behavior is conventionally defined as behavior intermediate between that of an ideal elastic solid symbolized by a spring of modulus and that of a Newtonian viscous liquid symbolized by a damper of viscosity.

Unless otherwise indicated, all the properties, for example the thermal conductivity, are measured under normal temperature and pressure conditions, that is to say under pressure of 1 bar, at 20° C.

Unless otherwise indicated, "to comprise", "to contain" and "to have" should be interpreted in a nonlimiting manner.

BRIEF DESCRIPTION OF THE FIGURES

Other features and advantages of the invention will become more apparent on reading the detailed description which follows and on examining the appended drawing in which.

DETAILED DESCRIPTION

Figure 1:
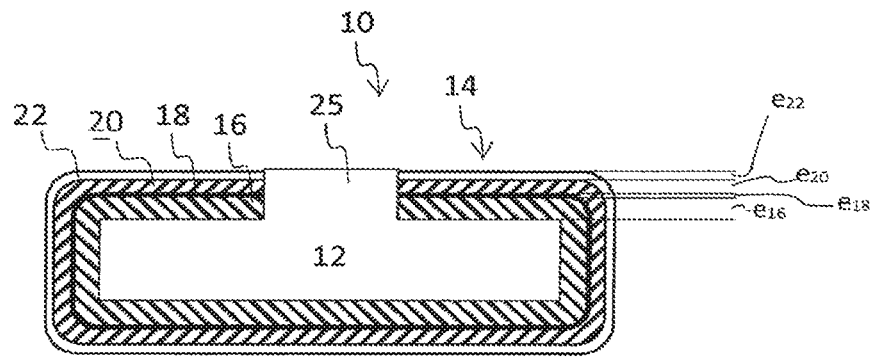
FIGS. 1, 2 and 3 represent, schematically, electronic devices according to the invention, in different embodiments.

The figures represent an electronic device 10 comprising an electronic component 12 and a protective shield 14.

The electronic component 12 may be any electronic component. In particular, it may consist of or comprise an electronic chip. It may be selected from PCBs, CPUs, MPUs or LEDs.

In one preferred embodiment, as represented, the electronic component is a video camera or a still camera. Preferably, the electronic component comprises a lens 25 which passes through the protective shield. Advantageously, the quality of the images acquired with this video camera or still camera is improved thereby.

Other routes of access to the electronic component, from the outside environment, are also possible, for example to make accessible a connector for recharging a battery of the electronic component or a control member of the electronic component, for example a release of a still camera or of a video camera.

In another embodiment, not illustrated, the electronic component 12 is hermetically isolated from the outside environment by the protective shield.

The protective shield comprises a phase change material and an antivibration gel.

The temperature of the phase change material is selected as a function of the targeted application, so that it is within the range of potential temperatures of the environment of the electronic device.

The phase change material is preferably selected from
solid/liquid phase change materials, in particular from
- salt hydrates, in particular sold by the company PCM Products,
- organic phase change materials, such as the paraffin RT70HC sold by the company Rubitherm, or fatty acids, for example stearic acid, in particular sold by the company Sigma Aldrich, solid/solid phase change materials, in particular X70 sold by the company PCM Products.

The phase change material is preferably a paraffin or a salt hydrate. Preferably, the phase change material is a paraffin, for example the paraffin RT70HC sold by the company Rubitherm. The paraffins advantageously have low conductivities and high latent heats.

The antivibration gel has hyperelastic and/or viscoelastic behavior at 20° C. It is capable of undergoing great deformations and of dissipating energy by having a good damping coefficient.

More preferably, the antivibration gel is selected from silicones that are optionally doped in order to improve the conductivity. The dopant may in particular contain ceramic particles and/or metallic particles, in particular aluminum oxide, boron nitride, zinc oxide and/or aluminum nitride particles. The antivibration gel is preferably selected from the silicone LSG6931 sold by the company Siliconrubber or the gels sold by the company Dow Corning, preferably the "TC-3040 Thermally conductive gel" gel or the "TC-6020 Thermally conductive encapsulant" gel which has a conductivity of greater than 2 W/m·K.

The antivibration gel may in particular be a silicone rubber referred to as a "platinum-catalyst component". This antivibration gel advantageously withstands high temperatures well, does not exude oil, has a thermal conductivity greater than 1 W/m·K and is not toxic.

In one embodiment, the thermal conductivity of the antivibration gel is greater than that of the phase change material.

The antivibration gel preferably has a dielectric strength of greater than 1 KV/mm in order to prevent short circuits.

The antivibration gel advantageously decreases the noise and the risk of disassembling the electronic components during the vibrations (high damping coefficient).

In the embodiment from FIG. 1, the protective shield 14 comprises, from the electronic component 12 to the outside environment E, an inner layer 16 of antivibration gel, an inner shell 18, an outer layer 20 made of a phase change material and an outer shell 22.

The antivibration gel of the inner layer 16 is in contact with the electronic component 12, and preferably encapsulates the electronic component 12. The thickness $e_{16}$ of the inner layer 16 may be constant or variable. In one embodiment, it is substantially constant. Preferably, the thickness $e_{16}$ is greater than 1 mm and less than 20 mm.

The inner shell 18 may be flexible or rigid. Preferably, it has a preferably constant thickness $e_{18}$ of less than 10 mm and, preferably, a thermal conductivity of greater than 10 W/mK, the objective being to not substantially impair the heat exchanges between the antivibration gel and the phase change material. The inner shell may in particular be formed of aluminum, titanium or stainless steel, preferably of aluminum.

Preferably, the inner shell 18 is hermetic, that is to say encloses the antivibration gel in a leaktight manner.

The thickness $e_{20}$ of the outer layer is preferably greater than 1 mm and/or less than 50 mm. It is preferably substantially constant.

Preferably, the outer layer 20 hermetically encapsulates the inner shell 18.

The use of an outer shell having a high thermal conductivity, preferably greater than 10 W/mK, preferably greater than 20 W/mK, preferably greater than 50 W/mK, preferably greater than 100 W/mK, preferably greater than 140 W/mK, advantageously favors the re-solidification of the phase change material when the temperature of the outside environment has come back down below the temperature of this material.

The outer shell 22 may have one or more of the features of the inner shell 18. Preferably, it is made of aluminum.

In one embodiment, the outer shell 22 has ribs that promote heat exchanges with the outside environment E, in the style of a radiator. Preferably, the ribs are arranged so as to substantially reinforce the mechanical properties of the outer shell. They may for example take the form of honeycombs.

Preferably, the protective shield is formed by the phase change material, the antivibration gel and the inner and outer shells.

Figure 2:
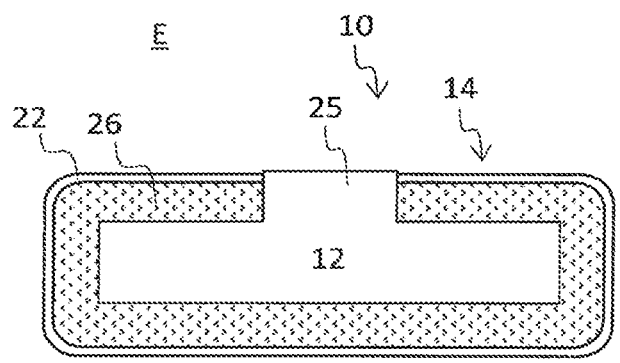

FIG. 2 represents another embodiment in which the electronic component 12 is embedded in a composite layer 26 comprising a mixture of antivibration gel and of capsules containing a phase change material. In particular, the phase change material may be encapsulated in capsules made of ceramic, of silica or of a polymer, preferably a thermosetting polymer (a natural or chemical, plastic polymer of polyethylene or polyamide, etc. type). The capsules have a diameter preferably of less than 1000 μm, less than 100 μm, less than 50 μm, less than 20 μm and/or greater than 5 μm or greater than 10 μm.

Advantageously, the capsules may be easily mixed with the antivibration gel. The wall of the capsules advantageously forms a separation barrier between the phase change material and the antivibration gel.

Figure 3:
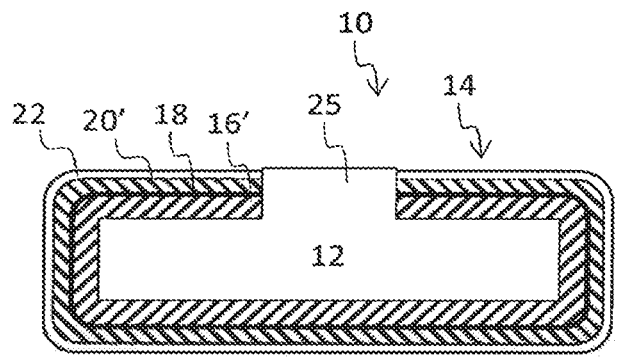

FIG. 3 represents another embodiment, similar to that of FIG. 1, but in which the antivibration gel forms the outer layer 20' and the phase change material forms the inner layer 16'. The other features of the outer layer 20 and inner layer 16 are applicable to the outer layer 20' and inner layer 16', respectively.

The nature and the arrangement of the antivibration gel and of the phase change material around the electronic component not limiting. They are preferably adjusted as a function of the constraints of the outside environment E and of the resistance capacities of the electronic component to the vibrations and to the temperature peaks.

In particular, in embodiments other than those represented, the protective shield comprises several layers of antivibration gel and/or several layers of phase change material. The protective shield may also comprise a composite layer and one or more layers of phase change material and/or layers of antivibration gel.

The order of these layers is not limiting.

The manufacture of an electronic device according to the invention does not pose any particular difficulties. The shells may advantageously be used to keep the phase change material and/or the antivibration gel in shape.

Preferably, the antivibration gel is injected through the inner shell.

Preferably, the phase change material is injected between the inner and outer shells.

EXAMPLES

Figure 4:
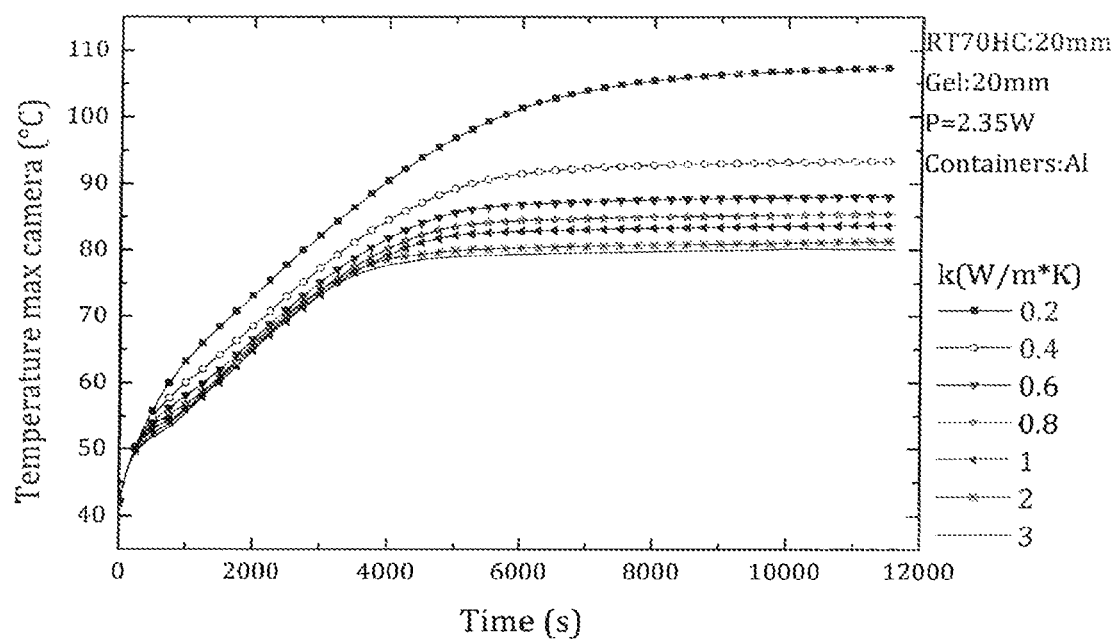
FIG. 4 illustrates the results of the tests performed.

FIG. 4 represents, as a function of the time, expressed in seconds, the maximum temperature, in ° C., along the ordinate axis, of an electronic component, in this case an infrared video camera, introduced into a protective shield of the type of that described in FIG. 1.

More specifically, the video camera dissipates 2.35 W in a constant manner. It has been embedded in an inner layer formed of an antivibration gel, namely the Dow Corning "TC-6020" gel having a thermal conductivity of 2.7 W/m·K, itself encapsulated in an inner shell having a thickness of 1 mm, made of aluminum, itself embedded in a layer of a phase change material, namely a paraffin RT70 HC, of which the phase change temperature is 70° C. and the thermal conductivity is 0.2 W/m·K.

The layers of antivibration gel and of phase change material each had a thickness of 20 mm. An outer shell made of aluminum, having a thickness of 1 mm, contained the video camera, the inner shell and the two protective layers. The temperature of the environment changed transiently between 40° C. and 120° C. over periods of between 1000 and 5000 s The graph of FIG. 4 represents the maximum temperature of the infrared video camera as a function of the time, in seconds. The curves represent the changes in this temperature for antivibration gels having thermal conductivities of 0.2 W/m·K, 0.4 W/m·K, 0.6 W/m·K, 0.8 W/m·K, 1 W/m·K, 2 W/m·K and 3 W/m·K from the upper curve to the lower curve.

This graph illustrates the remarkable effectiveness of a protective shield according to the invention for protecting the infrared video camera from high transient peaks (in our case, having an amplitude of greater than 100° C.).

As is now clearly apparent, the invention makes it possible to effectively protect an electronic component subjected to a vibration environment in which the temperature may reach, during peaks that may last several tens of minutes, or even several hours, high temperatures, and in particular may reach 120° C.

The invention also makes it possible to smooth the temperature changes of the electronic component and thus to improve the accuracy of the measurements, which is generally linked to the temperature changes. Finally, the invention limits the need for calibrating the measurement devices as a function of the temperature.

The material of the inner shell and/or of the outer shell is not limited. In particular, the inner shell and/or the outer shell may be formed of a stainless steel or of plastic.

The nature of the material forming the shells may be determined as a function of the targeted applications.

The shells may also enable and promote electromagnetic shielding. Electromagnetic shieldings are mainly used to protect electronic equipment from electrical interference and radiofrequencies. The shells, materials and thicknesses may be selected and adapted according to the outside electromagnetic environment.

In particular, a wire mesh may be integrated, by various modes of assembly (adhesive bonding, screwing, welding, etc.), within the inner shell and/or the outer shell.

The invention claimed is:

1. An electronic device to be used in a vibration environment having acceleration peaks of greater than 0.1 G and a temperature of which may exceed 90° C. for a period of more than 10 minutes, the electronic device comprising:
   an electronic component;
   a protective shield comprising:
      a phase change material having a phase change temperature of between 20° C. and 90° C., the phase change material forming an inner layer,
      an antivibration gel having at least one of hyperelastic or viscoelastic behavior at 20° C., the antivibration gel forming an outer layer, and
      a separation barrier positioned so as to separate the phase change material inner layer and the antivibration gel outer layer,
   the antivibration gel outer layer being positioned, at least partly, in contact with the electronic component, and having a thermal conductivity of greater than 1 W/m·K at 20° C.

2. The electronic device according to claim 1, in which the antivibration gel has a thermal conductivity of greater than 2 W/m·K at 20° C.

3. The electronic device according to claim 2, in which the antivibration gel has a thermal conductivity of greater than 2.5 W/m·K at 20° C.

4. The electronic device according to claim 1, in which the antivibration gel has a modulus of elasticity at 20° C. of less than 1 MPa.

5. The electronic device according to claim 1, in which the phase change material has a phase change temperature of greater than 60° C.

6. The electronic device according to claim 1, in which the phase change material is selected from the group formed by paraffins, fatty acids and salt hydrates.

7. The electronic device according to claim 1, in which the antivibration gel outer layer is positioned, at least partly, between the electronic component and the phase change material inner layer.

8. The electronic device according to claim 1, in which the antivibration gel outer layer is positioned, at least partly, between the electronic component and the phase change material inner layer, the separation barrier having the shape of an inner shell having a thickness of less than 3 mm, a material of said inner shell having a thermal conductivity of greater than 5 W/m·K.

9. The electronic device according to claim 1, in which the separation barrier is made of a material having a thermal conductivity of greater than 10 W/m·K.

10. The electronic device according to claim 1, further comprising an outer shell containing the electronic component, the phase change material inner layer, the antivibration gel outer layer, and said separation barrier.

11. The electronic device according to claim 10, in which a portion of the electronic component juts out beyond the outer shell.

12. The electronic device according to claim 10, in which the outer shell or an inner shell have ribs that promote heat exchanges between the phase change material inner layer and the outside environment, and between the antivibration gel outer layer and the phase change material inner layer, respectively.

13. The electronic device according to claim 10, in which the outer shell or an inner shell have electromagnetic shielding.

14. The electronic device according to claim 1, in which the electronic component comprises an infrared video camera.

15. The electronic device according to claim 1, in which the electronic component is embedded in the antivibration gel outer layer.

16. The electronic device according to claim 1, in which the electronic device is configured to monitor operation of an engine.

17. The electronic device according to claim 1, in which the electronic device is positioned in a motor vehicle, aircraft or spacecraft.

18. The electronic device according to claim 1, in which the acceleration peaks of the vibration environment are greater than 10 G and the temperature of the vibration environment exceeds 90° C. for a period of more than 30 minutes.

19. The electronic device according to claim 1, in which the acceleration peaks of the vibration environment are greater than 50 G and the temperature of the vibration environment exceeds 90° C. for a period of more than 60 minutes.

20. The electronic device according to claim 1, in which the electronic device is configured to thermally protect the electronic component from said vibration environment.

21. The electronic device according to claim 1, in which a portion of the electronic component passes through the protective shield, and the antivibration gel outer layer is free of direct contact with the electronic component except for said portion of the electronic component passing through the protective shield.

\* \* \* \* \*